(12) United States Patent
Huang

(10) Patent No.: US 7,382,196 B2
(45) Date of Patent: Jun. 3, 2008

(54) UHF ACTIVE ANTENNA AMPLIFIER FOR DIGITAL VIDEO BROADCAST (DVB) RECEIVER AND RELATED DVB DEVICE

(75) Inventor: Chen-Chia Huang, Taipei Hsien (TW)

(73) Assignee: Wistron NeWeb Corporation, Hsi-Chih, Taipei Hsien (TW)

(*) Notice: Subject to any disclaimer, the term of this patent is extended or adjusted under 35 U.S.C. 154(b) by 92 days.

(21) Appl. No.: 11/161,845

(22) Filed: Aug. 18, 2005

(65) Prior Publication Data
US 2007/0024373 A1 Feb. 1, 2007

(30) Foreign Application Priority Data
Jul. 14, 2005 (TW) .............................. 94123900 A

(51) Int. Cl.
*H03F 3/191* (2006.01)

(52) U.S. Cl. .................. 330/302; 330/252; 455/132

(58) Field of Classification Search ............... 330/302, 330/10, 252, 295; 455/132
See application file for complete search history.

(56) References Cited

U.S. PATENT DOCUMENTS

| 4,994,761 A | 2/1991 | Craft |
| 5,736,901 A | 4/1998 | Nakamura |
| 5,896,062 A * | 4/1999 | Tiller et al. ................. 330/252 |
| 6,404,823 B1 * | 6/2002 | Grange et al. .............. 375/297 |
| 6,990,323 B2 * | 1/2006 | Prikhodko et al. .......... 455/126 |
| 2004/0203546 A1 * | 10/2004 | Oh et al. .................... 455/132 |

* cited by examiner

*Primary Examiner*—Michael B Shingleton
(74) *Attorney, Agent, or Firm*—Winston Hsu

(57) ABSTRACT

An active UHF amplifier includes a transistor having a base for receiving signals, a grounded emitter, and a collector for outputting signals, a first inductor having a first end for coupling to a voltage source, the inductance of the first inductor being between 10-100 nano-Henries, a first capacitor having a first end coupled to the first end of the first inductor, a second inductor having a second end coupled to the base of the transistor, the inductance of the second inductor being between 1-100 nano-Henries, a second capacitor having a first end coupled to a first end of the second inductor, the capacitances of the first and the second capacitor being between 10 pico-Farads and 100 nano-Farads, a first resistor, and a second resistor having a resistance divided by the resistance of the first resistor and multiplied by a voltage of the voltage source being between 0.5-0.8 volts.

14 Claims, 3 Drawing Sheets

UHF ACTIVE ANTENNA AMPLIFIER FOR DIGITAL VIDEO BROADCAST (DVB) RECEIVER AND RELATED DVB DEVICE

BACKGROUND OF THE INVENTION

1. Field of the Invention

The present invention relates to an amplifier, and more particularly, to a UHF active antenna amplifier for a digital video broadcast (DVB) receiver and related DVB devices.

2. Description of the Prior Art

In recent years, the quality of a wireless TV broadcasts has been improved dramatically due to the rapid development of digital TVs. Accordingly, channels adopted by the wireless TV broadcasts have been promoted from a conventional very high frequency (VHF) channel to a popular ultra high frequency (UHF) channel.

In a wireless TV broadcast system, wireless signals received by a passive antenna are transferred, without any processing, to a digital video broadcast (DVB) receiver via a cable. The length of the cable greatly affects the quality of the wireless signals received by the DVB receiver—the longer the cable is, the more noise-vulnerable the wireless signals transferred over the cable become, and therefore have a very poor signal-to-noise ratio (SNR).

SUMMARY OF THE INVENTION

It is therefore a primary objective of the claimed invention to provide a UHF active antenna amplifier for a digital video broadcast (DVB) receiver and related DVB device to improve the sensitivity of a digital TV for receiving wireless signals, and to overcome the above-mentioned problems.

According to the claimed invention, the UHF active antenna amplifier includes a first inductor, a first capacitor, a second inductor, a second capacitor, a first resistor, a second resistor, a regulator, a third inductor, and a third capacitor. The transistor has a base for receiving signals, a grounded emitter, and a collector for outputting signals. The first inductor has a first end for coupling to a voltage source, and a second end coupled to the collector of the transistor, the inductance of the first inductor being between 10 and 100 nano-Henries. The first capacitor has a first end coupled to the first end of the first inductor, and a grounded second end, the capacitance of the first capacitor being between 10 pico-Farads and 100 nano-Farads. The second inductor has a second end coupled to the base of the transistor, the inductance of the second inductor being between 1 and 100 nano-Henries. The second capacitor has a first end coupled to a first end of the second inductor, and a grounded second end, the capacitance of the second capacitor being between 10 pico-Farads and 100 nano-Farads. The first resistor has a first end coupled to the first end of the first inductor, and a second end coupled to a first end of the second inductor. The second resistor has a first end coupled to the second end of the first resistor, and a grounded second end. A voltage level of the voltage source multiplied by the resistance of the first resistor and divided by the resistance of the second resistor is between 0.5 to 0.8 volts. The regulator has an input end coupled to the first end of the first capacitor, and a grounded second end. The third capacitor has a first end coupled to an output end of the regulator, and a grounded second end, the capacitance of the second capacitor being between 10 pico-Farads and 100 nano-Farads. The third inductor has a first end coupled to the output end of the regulator, and a second end for outputting signals, the inductance of the third inductor being between 10 and 220 nano-Henries.

These and other objectives of the present invention will no doubt become obvious to those of ordinary skill in the art after reading the following detailed description of the preferred embodiment that is illustrated in the various figures and drawings.

DETAILED DESCRIPTION

The present invention, through the installation of a UHF active antenna amplifier between a passive antenna and a cable, reduces the loss of wireless signals received by the active antenna and transferred over the cable to a digital video broadcast (DVB) receiver, and improves the sensitivity of a digital TV having the DVB receiver for receiving the wireless signals.

Figure 1:
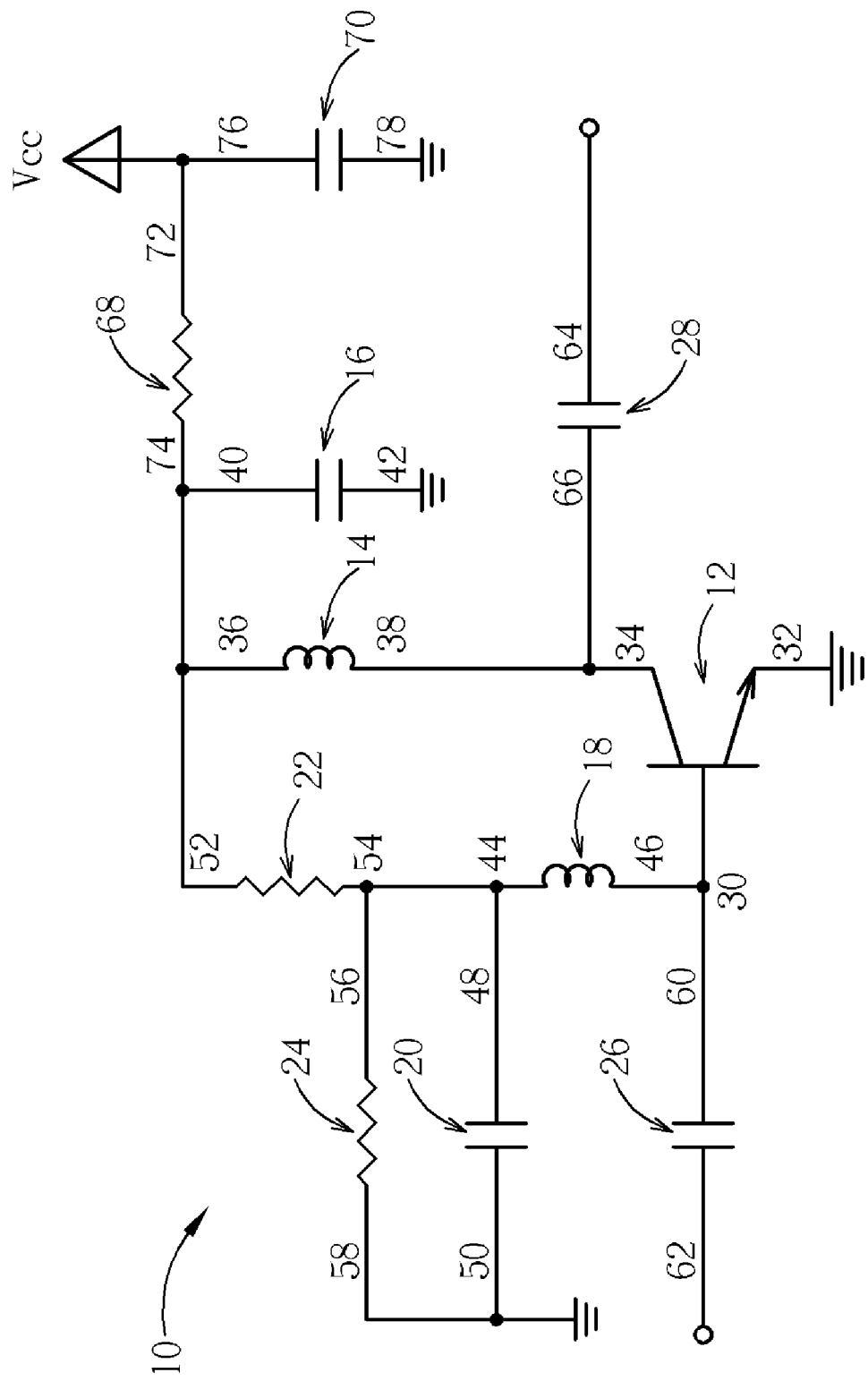
FIG. 1 is a circuit diagram of a UHF active antenna amplifier of a first embodiment according to the present invention.

Please refer to FIG. 1, which is a circuit diagram of a UHF active antenna amplifier 10 of a first embodiment according to the present invention. The amplifier 10 comprises a transistor 12, a first inductor 14, a first capacitor 16, a second inductor 18, a second capacitor 20, a first resistor 22, a second resistor 24, an input capacitor, an output capacitor 28, a third resistor 68, and a fourth capacitor 70.

The transistor 12 comprises a base 30 for receiving wireless signals, a grounded emitter 32, and a collector 34 for outputting amplified wireless signals, which have better SNR. The base 30 acts as an input end of the amplifier 30, and the collector 34 acts as an output end of the amplifier 30. The first inductor 14 comprises a first end 36 for coupling to a voltage source Vcc, and a second end 38 coupled to the collector 34 of the transistor 12. The first capacitor 16 comprises a first end 40 coupled to the first end 36 of the first inductor 14, and a grounded second end 42. The second inductor 18 comprises a first end 44 and a second end 46 coupled to the base 30 of the transistor 12. The second capacitor 20 comprises a first end 48 coupled to the first end 44 of the second inductor 18, and a grounded second end 50. The first resistor 22 comprises a first end 52 coupled to the first end 36 of the first inductor 14, and a second end 54 coupled to the first end 44 of the second inductor 18. The second resistor 24 comprises a first end 56 coupled to the second end 54 of the first resistor 22, and a grounded second end 58. The input capacitor 26 comprises a first end 60 coupled to the base 30 of the transistor 12, and a second end 62 for receiving wireless signals and transferring the received wireless signals via the first end 60 to the base 30 of the transistor 12. The output capacitor 28 comprises a second end 66 coupled to the collector 34 of the transistor 12, and a first end 64 for outputting the wireless signals, which have better SNR, output from the collector 34 of the transistor 12. The third resistor 68 comprises a first end 72 for coupling to the voltage source Vcc, and a second end 74 coupled to the first end 40 of the second capacitor 16. The fourth capacitor 70 comprises a grounded second end 78, and a first end 76 for coupling to the voltage source Vcc.

The first inductor 14 and the first capacitor 16 form an input impedance match circuit. The second inductor 18 and the second capacitor 20 form an output impedance match circuit. The first resistor 22 and the second resistor 24 form a voltage divider to provide a DC biased voltage for the transistor 12. The input capacitor 26 and the output capacitor 28 act as DC blocks on the input end and on output end of the amplifier 10 respectively. That is, the input capacitor 26 and the output capacitor 28 are capable of blocking any DC currents passing through the amplifier 10, and allow only the wireless signals to pass. The third resistor 68 acts as a negative feedback resistor, which is capable of stabilizing the DC current of the transistor 12.

As mentioned previously, the channels adopted by the wireless TV broadcasts have been promoted to the UHF channels, which comprise 470 to 810 MHz, in order to be applied to DVB receiver of the digital TV, the amplifier 10 of the first embodiment of the present invention selects an NE 68119 transistor as the transistor 12, an inductor having an inductance being between 10 and 100 nano-Henries as the first inductor 14, an capacitor having a capacitance being between 10 pico-Farads and 100 nano-Farads as the first capacitor 16, another inductor having an inductance being between 1 and 100 nano-Henries as the second inductor 18, another capacitor having a capacitance being between 10 pico-Farads and 100 nano-Farads as the second capacitor 20, another capacitor having a capacitance being between 10 pico-Farads and 100 nano-Farads as the input capacitor 26, another capacitor having a capacitance being between 10 pico-Farads and 100 nano-Farads as the output capacitor 28, another capacitor having a capacitance being between 100 pico-Farads and 100 micro-Farads as the fourth capacitor 70, and a voltage level of the voltage source Vcc multiplied by a first resistance of the first resistor 22 and divided by a second resistance of the second resistor 24 being between 0.5-0.8 volts, and a voltage level subtracted by 2 and divided by a third resistance of the third resistor 68 being between 0.005-0.05 amps.

Figure 2:
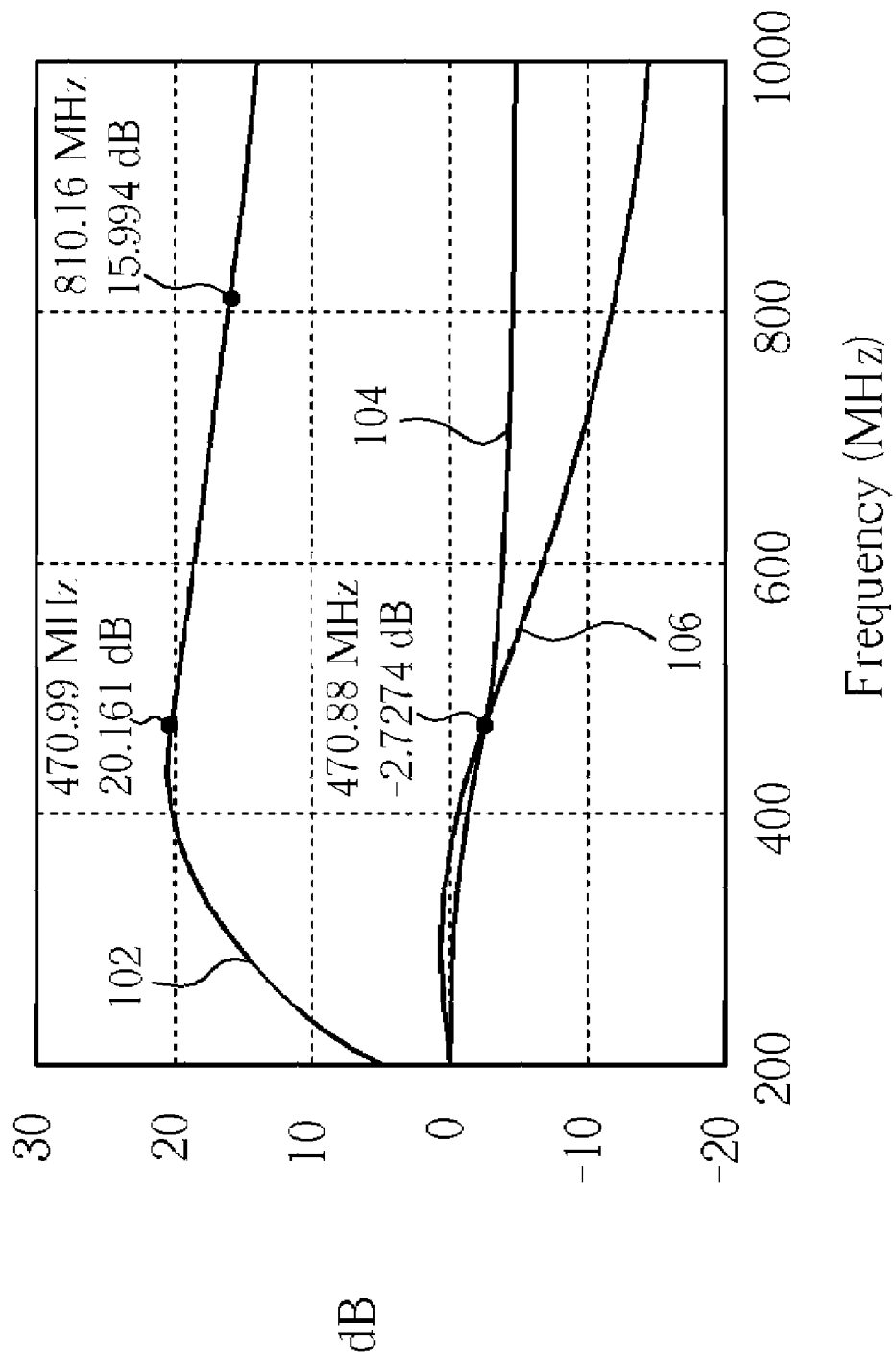
FIG. 2 is a waveform diagram.

Please refer to FIG. 2, which is a waveform diagram showing three wireless signals, where an abscissa represents frequencies, and an ordinate represents dB values. It can be seen from FIG. 2 that a wireless signal 102 output from the amplifier 10 has a dB value larger than the dB values of wireless signals output from other amplifiers selecting other transistors, resistors, capacitors, and/or inductors on the channel of 470 to 810 MHz. In conclusion, the amplifier 10 of the present invention indeed reduces the loss of the wireless signals received by the passive antenna and transferred over the cable to the DVB receiver, and improves the sensitivity of the digital TV having the DVB receiver for receiving wireless signals.

Please note that, in the first embodiment, if the amplifier 10 is capable of overcoming the problem of DC current passing through the amplifier 10, both the input capacitor 26 and the output capacitor 28 can be omitted. Moreover, the second resistor 24, the third resistor 68, and/or the fourth capacitor 70 can be omitted.

Figure 3:
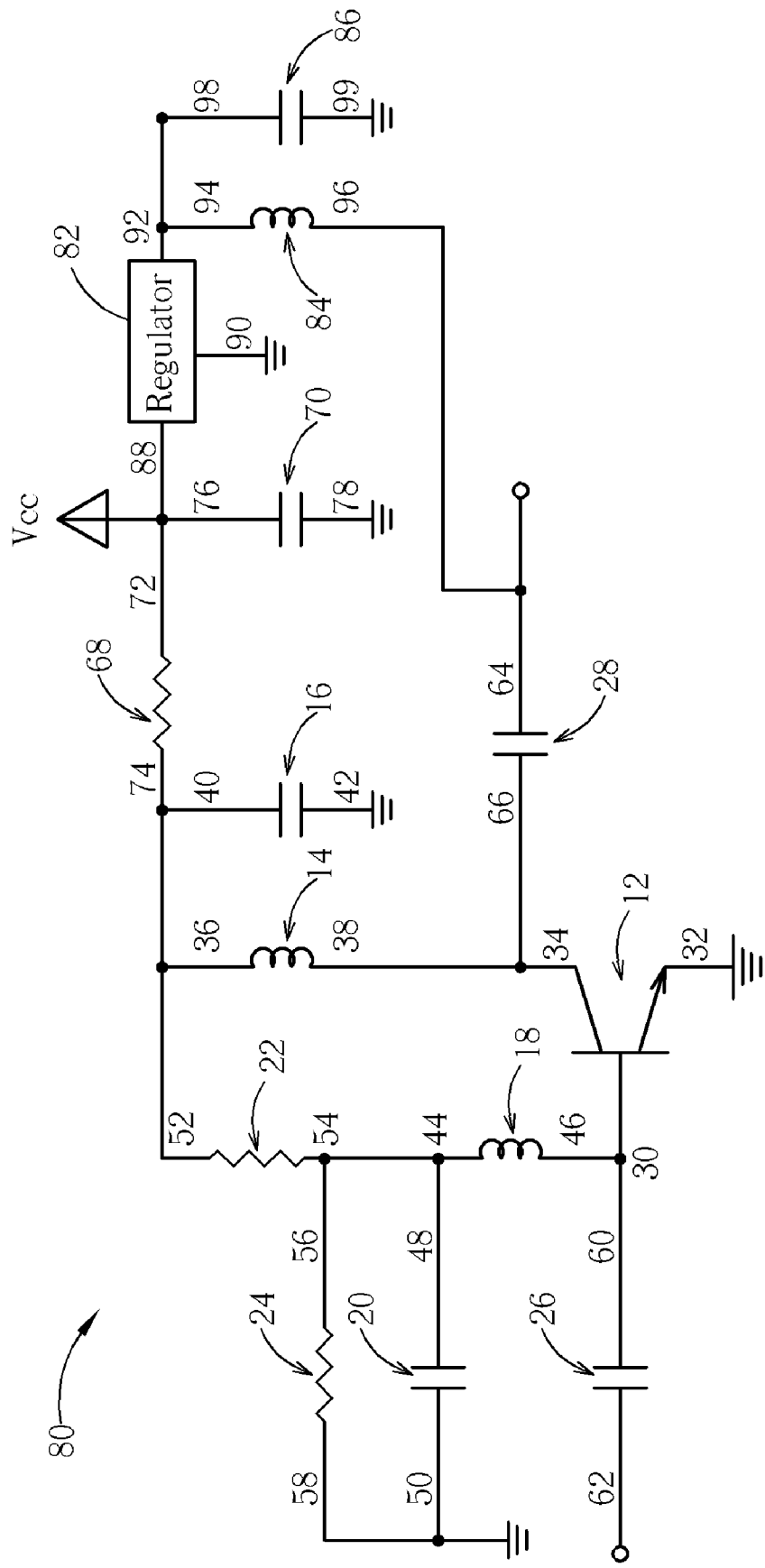
FIG. 3 is a circuit diagram of a UHF active antenna amplifier of a second embodiment according to the present invention.

The amplifier 10 shown in FIG. 1 cannot function without being coupled to the voltage source Vcc. However, another amplifier of the present invention can function normally without being coupled to an external voltage source. Please refer to FIG. 3, which is a circuit diagram of a UHF active antenna amplifier 80 of a second embodiment according to the present invention. The amplifier 80 can also be coupled via the cable to the DVB receiver. In addition to the transistor 12, the first inductor 14, the first capacitor 16, the second inductor 18, the second capacitor 20, the first resistor 22, the second resistor 22, the input capacitor 26, the output capacitor 28, the third resistor 68, and the fourth capacitor 70, the amplifier 80 further comprises a regulator 82, a third inductor 84, and a third capacitor 86. Similarly, the input capacitor 26, the output capacitor 28, the second resistor 24, the third resistor 68, and/or the fourth capacitor 70 can be omitted.

The regulator 82 comprises a ground end 90, an output end 92, and an input end 88 coupled to the first end 40 of the first capacitor 16 (if the third resistor 98 is omitted) or to the first end 72 of the third resistor 68. The third capacitor 86 comprises a first end 98 coupled to the output end 92 of the regulator 82, and a grounded second end 99. The third inductor 84 comprises a first end 94 coupled to the output end 92 of the regulator 82, and a second end 96 coupled to the collector 34 of the transistor 12 (if the output capacitor 28 is omitted), or to the first end 64 of the output capacitor 28 for outputting signals.

Having the regulator 82, the amplifier 80 does not have to include an external voltage source line used to couple to a voltage source. A DC voltage source needed by the amplifier 80, that is the voltage source Vcc, can be acquired by receiving DC power provided to an input end of the DVB receiver via a high frequency signal line coupled between the collector 34 of the transistor 12 and the DVB receiver. In the second embodiment, the third capacitor 86 and the fourth capacitor 70 are the capacitors needed by the regulator 82 to function normally. The third capacitor 84 is installed to provide a DC route, and to block wireless signals of high frequency.

In addition to the transistor 12, the three resistors 22, 24, 68, the two inductors 14, 18, and the five capacitors 16, 20, 86, 26, 28, the amplifier 80 further comprises an inductor having an inductance being between 10-220 nano-Henries to act as the third inductor 84, and a capacitor having a capacitance being between 10 pico-Farads and 100 micro-Farads to act as the third capacitor 86.

In contrast to the prior art, the amplifiers 10, 80 of the present invention comprise a variety of electronic components of specific values. Therefore, the amplifiers 10, 80 reduce the loss of wireless signals received by the active antenna and transferred over the cable to a DVB receiver, and improve the sensitivity of a digital TV having the DVB receiver for receiving the wireless signals.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A UHF active antenna amplifier comprising:
   a transistor having a base for receiving signals, a grounded emitter, and a collector for outputting signals;
   a first inductor having a first end for coupling to a voltage source, and a second end coupled to the collector of the transistor, the inductance of the first inductor being between 10 and 100 nano-Henries;
   a first capacitor having a first end coupled to the first end of the first inductor, and a grounded second end, the capacitance of the first capacitor being between 10 pico-Farads and 100 nano-Farads;
   a second inductor having a second end coupled to the base of the transistor, the inductance of the second inductor being between 1 and 100 nano-Henries;
   a second capacitor having a first end coupled to a first end of the second inductor, and a grounded second end, the capacitance of the second capacitor being between 10 pico-Farads and 100 nano-Farads; and a first resistor having a first end coupled to the first end of
the first inductor, and a second end directly connected
to a first end of the second inductor.

2. The UHF active antenna amplifier of claim 1 further comprising a second resistor having a first end coupled to the second end of the first resistor, and a rounded second end, a voltage level of the voltage source multiplied by the resistance of the first resistor and divided by the resistance of the second resistor being between 0.5-0.8 volts.

3. The UHF active antenna amplifier of claim 1 further comprising an input capacitor having a first end coupled to the base of the transistor, and a second end the receiving signals, the capacitance of the input capacitor being between 10 pico-Farads and 100 nano-Farads.

4. The UHF active antenna amplifier of claim 1 further comprising an output capacitor having a first end for outputting signals, and a second end coupled to the collector of the transistor, the capacitance of the output capacitor being between 10 pico-Farads and 100 nano-Farads.

5. The UHF active antenna amplifier of claim 1 further comprising a third resistor having a first end for coupling to the voltage source, and a second end coupled to the first end of the first capacitor, a voltage level of the voltage source subtracted by two and divided by the resistance of the third resistor being between 0.005-0.05 amps.

6. The UHF active antenna amplifier of claim 1 further comprising a fourth capacitor having a first end for coupling to the voltage source, and a grounded second end, the capacitance of the fourth capacitor being between 100 pico-Farads and 100 micro-Farads.

7. A UHF active antenna amplifier comprising:
a transistor having a base for receiving signals, a grounded emitter, and a collector for outputting signals;
a first inductor having a first end for coupling to a voltage source, and a second end coupled to the collector of the transistor, the inductance of the first inductor being between 10 and 100 nano-Henries;
a first capacitor having a first end coupled to the first end of the first inductor, and a grounded second end, the capacitance of the first capacitor being between 10 pico-Farads and 100 nano-Farads;
a second inductor having a second end coupled to the base of the transistor, the inductance of the second inductor being between 1 and 100 nano-Henries;
a second capacitor having a first end coupled to a first end of the second inductor, and a wounded second end, the capacitance of the second capacitor being between 10 pico-Farads and 100 nano-Farads;
a first resistor having a first end coupled to the first end of the first inductor, and a second end directly connected to a first end of the second inductor;
a regulator having an input end coupled to the first end of the first capacitor, and a grounded second end;
a third capacitor having a first end coupled to an output end of the regulator, and a grounded second end, the capacitance of the second capacitor being between 10 pico-Farads and 100 nano-Farads; and
a third inductor having a first end coupled to the output end of the regulator, and a second end for outputting signals, the inductance of the third inductor being between 10 and 220 nano-Henries.

8. The UHF active antenna amplifier of claim 7 further comprising a second resistor having a first end coupled to the second end of the first resistor, and a grounded second end, a voltage level of the voltage source multiplied by the resistance of the first resistor and divided by the resistance of the second resistor being between 0.5-0.8 volts.

9. The UHF active antenna amplifier of claim 7 further comprising an input capacitor having a first end coupled to the base of the transistor, and a second end for receiving signals, the capacitance of the input capacitor being between 10 pico-Farads and 100 nano-Farads.

10. The UHF active antenna amplifier of claim 7 further comprising an output capacitor having a first end for outputting signals, and a second end coupled to the collector of the transistor, the capacitance of the output capacitor being between 10 pico-Farads and 100 nano-Farads.

11. The UHF active antenna amplifier of claim 7 further comprising a third resistor having a first end coupled to the input end of the regulator; and a second end coupled to the first end of the first capacitor, a voltage level of the voltage source subtracted by two and divided by the resistance of the third resistor being between 0.005-0.05 amps.

12. The UHF active antenna amplifier of claim 7 farther comprising a fourth capacitor having a first end coupled to the input end of the regulator, and a grounded second end, the capacitance of the fourth capacitor being between 100 pico-Farads and 100 micro-Farads.

13. A digital video broadcast (DVB) device comprising:
a UHF active antenna amplifier comprising;
a transistor having a base for receiving signals, a grounded emitter, and a collector for outputting signals;
a first inductor having a first end for coupling to a voltage source, and a second end coupled to tile collector of the transistor, the inductance of the first inductor being between 10 and 100 nano-Henries;
a first capacitor having a first end coupled to the first end of the first inductor, and a grounded second end, the capacitance of the first capacitor being between 10 pico-Farads and 100 nano-Farads;
a second inductor having a second end coupled to the base of the transistor, the inductance of the second inductor being between 1 and 100 nano-Henries;
a second capacitor having a first end coupled to a first end of the second inductor, and a grounded second end, the capacitance of the second capacitor being between 10 pico-Farads and 100 nano-Farads; and
a first resistor having a first end coupled to the first end of the first inductor, and a second end directly connected to a first end of the second inductor; and
a digital video broadcast receiver coupled to the collector of the transistor of the UHF active antenna amplifier for receiving the signals output from the collector of the transistor of the UHF active antenna amplifier.

14. A digital video broadcast device comprising:
a UHF active antenna amplifier comprising:
a transistor having a base for receiving signals, a grounded emitter, and a collector for outputting signals;
a first inductor having a first end for coupling to a voltage source, and a second end coupled to the collector of the transistor, the inductance of the first inductor being between 10 and 100 nano-Henries;
a first capacitor having a first end coupled to the first end of the first inductor, and a grounded second end, the capacitance of the first capacitor being between 10 pico-Farads and 100 nano-Farads;
a second inductor having a second end coupled to the base of the transistor, the inductance of the second inductor being between 1 and 100 nano-Henries;
a second capacitor having a first end coupled to a first end of the second inductor, and a grounded second end, the capacitance of the second capacitor being between 10 pico-Farads and 100 nano-Farads;
a first resistor having a first end coupled to the first end of the first inductor, and a second end directly connected to a first end of the second inductor;
a regulator having an input end coupled to the first end of the first capacitor, and a grounded second end;
a third capacitor having a first end coupled to an output end of the regulator; and a grounded second end, the capacitance of the second capacitor being between 10 pico-Farads and 100 nano-Farads; and a third inductor having a first end coupled to the output end of the regulator, and a second end for outputting signals, the inductance of the third inductor being between 10 and 220 nano-Henries; and
a digital video broadcast receiver coupled to the collector of the transistor of the UHF active antenna amplifier for receiving the signals output from the collector of the transistor of the UHF active antenna amplifier.

\* \* \* \* \*